US007504632B2

(12) United States Patent
Wunderer et al.

(10) Patent No.: US 7,504,632 B2
(45) Date of Patent: Mar. 17, 2009

(54) APPARATUS FOR CHECKING BANKNOTES

(75) Inventors: Bernd Wunderer, München (DE); Klaus Thierauf, München (DE); Norbert Holl, Germering (DE); Dieter Stein, Holzkirchen (DE)

(73) Assignee: Giesecke & Devrient GmbH, Munich (DE)

( * ) Notice: Subject to any disclaimer, the term of this patent is extended or adjusted under 35 U.S.C. 154(b) by 127 days.

(21) Appl. No.: 10/557,825

(22) PCT Filed: May 21, 2004

(86) PCT No.: PCT/EP2004/005515

§ 371 (c)(1),
(2), (4) Date: Oct. 19, 2006

(87) PCT Pub. No.: WO2004/104947

PCT Pub. Date: Dec. 2, 2004

(65) Prior Publication Data

US 2007/0187579 A1 Aug. 16, 2007

(30) Foreign Application Priority Data

May 23, 2003 (DE) ................................ 103 23 410

(51) Int. Cl.
*H01L 27/00* (2006.01)

(52) U.S. Cl. .................... 250/341.8; 358/512; 358/514; 382/135

(58) Field of Classification Search .............. 250/341.8; 358/512, 513, 514; 382/135
See application file for complete search history.

(56) References Cited

U.S. PATENT DOCUMENTS

| | | | | |
|---|---|---|---|---|
| 5,034,616 | A | 7/1991 | Bercovitz | |
| 5,801,373 | A * | 9/1998 | Oozu et al. | 250/208.1 |
| 5,965,875 | A * | 10/1999 | Merrill | 250/226 |
| 6,094,281 | A * | 7/2000 | Nakai et al. | 358/512 |
| 6,252,220 | B1 * | 6/2001 | Jedlicka et al. | 250/208.1 |
| 6,768,123 | B2 | 7/2004 | Giering | |
| 2004/0125222 | A1 * | 7/2004 | Bradski et al. | 348/272 |

FOREIGN PATENT DOCUMENTS

| | | | |
|---|---|---|---|
| DE | 195 17 194 | A1 | 11/1996 |
| DE | 101 27 836 | | 1/2003 |
| EP | 0 395 833 | | 11/1990 |
| EP | 0 594 446 | A1 | 4/1994 |
| EP | 1 265 198 | A2 | 12/2002 |
| EP | 1 265 199 | | 12/2002 |

* cited by examiner

*Primary Examiner*—David P Porta
*Assistant Examiner*—Jessica L Eley
(74) *Attorney, Agent, or Firm*—Bacon & Thomas, PLLC

(57) ABSTRACT

An apparatus for checking bank notes which scans the bank notes to be checked by means of a semiconductor array, including two linear semiconductor arrays formed of at least three layers which are sensitive to light of different wavelengths, a first linear semiconductor array scanning the bank notes in a defined range of spectral sensitivity of the semiconductor (e.g. in the visible range), and a second linear semiconductor array scanning the bank notes in a range different therefrom (e.g. of invisible infrared light). From the signals of the two arrays a color image of the bank note and at least one image in the range of invisible light are obtained by suitable combination.

10 Claims, 1 Drawing Sheet

APPARATUS FOR CHECKING BANKNOTES

BACKGROUND

Figure 1:
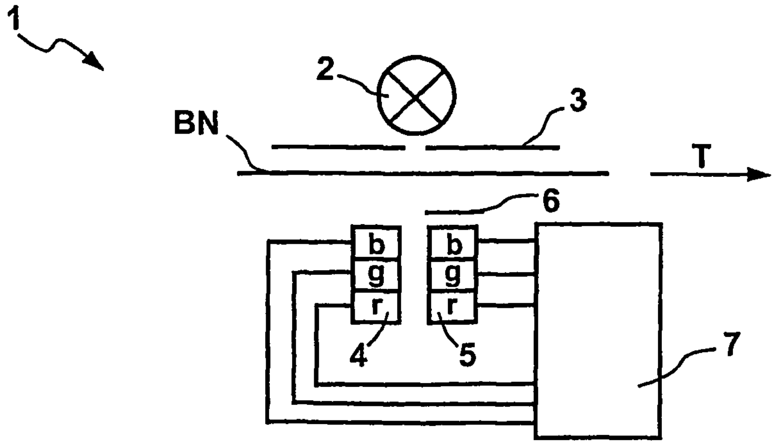

This invention relates to an apparatus for checking bank notes which scans the bank notes to be checked by means of a semiconductor array.

RELATED ART

Such an apparatus is known for example from DE 195 171 94 A1. In the known apparatus a CCD array is provided which is formed by four single, parallel, linear CCD arrays disposed a constant distance apart. Each of the CCD arrays has a filter with a certain filter characteristic, so that one CCD array detects the range of blue light, one CCD array the range of green light, one CCD array the range of red light, and one CCD array the range of infrared light. When the bank notes to be checked are moved past the sensor, pixels of the particular bank note are detected by the linear CCD arrays and stored for further processing. Since the speed at which the bank notes are moved past the CCD arrays and the distance between the CCD arrays are known, an image of the particular bank note can be produced linearly from the stored pixels. By means of the CCD arrays for the blue, green and red ranges of light a color image of the bank notes can be produced; by means of the CCD array for the infrared range of light an image of usually invisible properties of the bank notes, e.g. of their printing inks, can be produced.

The known apparatus has the disadvantage, however, that the CCD array used is elaborate since a multiplicity of filters must be used to permit the individual linear CCD arrays to detect the desired color ranges. Moreover, problems can arise in the composition of the color image of the particular bank note from the pixels of the blue, green and red CCD arrays, since their spaced arrangement can cause parallactic errors when the geometric image scale and the line frequency are not adapted accordingly. This can lead to so-called moire effects in particular at light/dark transitions.

U.S. Pat. No. 5,965,875 discloses a color image sensor formed by a semiconductor array having three successive layers, each of the three layers being sensitive to a certain light component. Use is made of the well-known property of silicon that the penetration depth of light is dependent on the wavelength of the light. Light with a greater wavelength will penetrate deeper into silicon before it is absorbed. This results, from the side of light admission, in a first very thin layer which mainly detects blue light, a second thicker layer which detects primarily green light, and a third layer which detects red and infrared light. Since the layers sensitive to the different light ranges, or the particular pixels, are successive, they always image the same pixel of the particular bank note to be checked. No problems with parallactic errors between the three signals can thus arise. By a suitable (usually linear) combination of the three signals of each pixel, its blue, green and red signals are obtained.

The known color sensor has the disadvantage, however, that only three wavelength ranges can be detected which are within the sensitivity range of silicon from approx. 380 to approx. 1100 nm. For applications in photography the sensor is provided with an infrared blocking filter which cuts off wavelengths over approx. 680 nm. In particular wavelength ranges important for checking bank notes which are in the invisible (infrared) range of light can then not be detected.

It is basically conceivable and possible to extend the known color sensor by at least one further layer which serves for example to detect the infrared range, but such sensors are not freely available and must therefore first be developed in their structure and produced as custom-made products. In view of the well-known effort involved in the area of semiconductor product manufacture, however, such custom-made products are very elaborate.

It is therefore the problem of the present invention to specify an apparatus for checking bank notes which scans the bank notes to be checked by means of such a semiconductor array and which provides all required check results with minimal effort.

BRIEF SUMMARY OF PREFERRED EMBODIMENTS OF THE INVENTION

The invention starts out from an apparatus for checking bank notes which scans the bank notes to be checked by means of a semiconductor array, the semiconductor array being formed by at least two parallel spaced, linear semiconductor arrays, and the bank notes being moved for the check past the semiconductor array and illuminated by a light source, wherein the linear semiconductor arrays are formed by at least three layers which are sensitive to light of different wavelengths, a first linear semiconductor array scanning the bank notes in a defined spectral range of light within the spectral sensitivity of the semiconductor, and a second linear semiconductor array scanning the bank notes in a range different therefrom, for which purpose at least the second linear semiconductor array has a filter.

Three cases of embodiments are distinguishable here. In the first case the first semiconductor array has no filter and the second has a filter which passes exclusively invisible light. In the second case the first semiconductor array has no filter and the second has a filter which blocks invisible light. In the third case the first semiconductor array has a filter which blocks invisible light and the second has a filter which passes exclusively invisible light.

In all three cases it is possible to obtain the four required signals, that is, three color signals and one signal for the invisible range, by a suitable, in the simplest case linear, combination of the six signals from the two semiconductor arrays.

In the first and third cases it is conceivable, as an extension, for the invisible light passed by the filter to comprise not only the infrared but also the ultraviolet component of the spectrum below approx. 390 nm. This component will contribute exclusively to the signal of the uppermost layer of the array due to the extremely short penetration depth of ultraviolet light into the semiconductor of the array. The infrared signal of the uppermost layer can be derived from the signal of the two layers therebelow when the visible component of the spectrum (between about 390 and 700 nm) is blocked, and be used with a suitable weight, defined by the sensitivity and illumination spectra, for correcting the signal of the first layer, so that the signal in the ultraviolet range can be obtained additionally as a fifth one.

The inventive apparatus has the advantage that it can be realized simply and economically with existing technology, and provides good check results due to the reduction of artifacts which can be caused for example by parallactic errors. In particular the production of the filters is greatly simplified; they can in some cases even be formed as organic synthetic filters and be applied directly to the substrate of the detector arrays e.g. by so-called spin coating.

In an advantageous embodiment of the apparatus, it is provided that a control and evaluation device is present which processes and evaluates signals from the semiconductor array in order to produce a color image and an image in the range of invisible light from the signals of the layers of the two linear semiconductor arrays for each bank note to be checked.

The control and evaluation device then functions in the three above-described cases as follows.

In the first case, the first array provides signals from the total spectrum, the second only from the invisible range. The three signals of the second array can simply be summed here. They then provide the image in the invisible range. This image is used with suitable weights for correcting the color signals in the visible range of the spectrum.

In the second case, the first array provides signals from the total spectrum, the second only signals from the visible range. These can be used directly without further correction. The image in the invisible range is obtained from the signals of the first array by reducing its signals by the corresponding signals of the second array and then summing them.

In the third case, both arrays are provided with filters having mutually exclusive pass bands, so that the first array provides the color image and the second array the invisible image by summation.

The inventive apparatus has in particular the advantage that the lower sensitivity of semiconductor arrays in the invisible range is improved by summation of the signals of the three layers, which permits better check results to be achieved.

Figure 2:
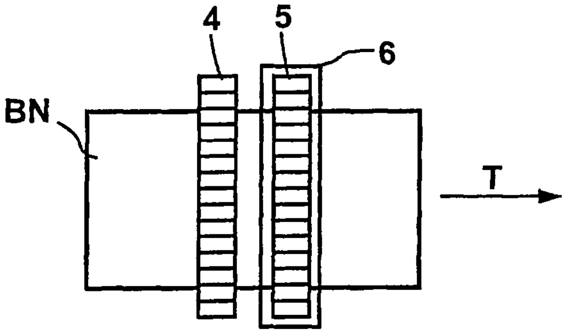
Figure 3:
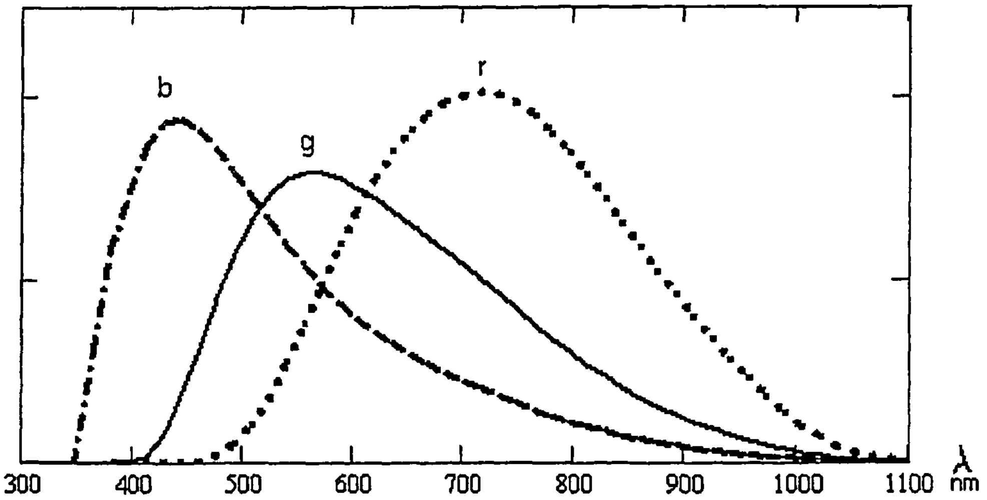

Further advantages of the present invention will be explained and described in more detail hereinafter with reference to the enclosed figures, in which:

FIG. 1 shows a schematic view of an apparatus for checking bank notes which scans the bank notes to be checked by means of a semiconductor array 4, 5, FIG. 2 shows a further schematic view of the apparatus according to FIG. 1 from another angle, and FIG. 3 shows a representation of the spectral sensitivities of the three layers of a semiconductor array according to FIG. 1, for layer thicknesses yielding approximately the same sensitivity for the three layers.

The apparatus 1 for checking bank notes BN shown in FIG. 1 has a semiconductor array 4, 5 with which the bank notes BN to be checked are scanned when moved past the semiconductor array 4, 5 in transport direction T by a transport device not shown. The semiconductor array 4, 5 consists of two parallel, linear arrays 4 and 5 which have three successive layers b, g, r sensitive to light of different wavelengths. The linear arrays 4, 5 can be separate components, but they can also be disposed on a single component, in particular a single semiconductor substrate. The semiconductor arrays 4, 5 can be made e.g. of silicon and be built in CMOS technology.

The sensitivity of the layers b, g, r is shown in FIG. 3. The uppermost layer b is maximally sensitive to blue light, the middle layer g to green light, and the lower-most layer r to red light. The exact relations in such CMOS arrays of layered structure can be taken for example from U.S. Pat. No. 5,965,875 mentioned at the outset. The layer thicknesses are different, so that approximately the same sensitivity arises for the three layers b, g, r in accordance with the wavelength-dependent absorption of silicon.

A light source 2 illuminates the bank note BN to be checked. By means of a diaphragm 3 or suitable optic, an illuminated area on the bank note BN is produced which corresponds approximately to the image of the CMOS array 4, 5. The light of the light source 2 comprises wavelength ranges needed for checking the bank note BN, i.e. in particular the range of visible light as well as the range of infrared or ultraviolet light. The intensity of the light source 2 is preferably constant over the total relevant wavelength range, or the spectral pattern of the intensity of the light source 2 is adapted to the pattern of the total sensitivity of the CMOS array, as described e.g. in the applicant's non-prepublished German patent application 10239225.0.

With the linear CMOS arrays 4, 5 the bank note BN is scanned pixelwise over its total width, as shown in FIG. 2. If scanning is effected in synchronism with the transport speed of the bank note BN, a complete color and infrared image of the bank note BN can be produced. With regard to the procedure required therefor, in particular synchronism with the transport speed of the bank notes BN, reference is made to DE 195 17 194 A1 mentioned at the outset.

By means of the signals of the first linear CMOS array 4 the color image of the bank note BN is produced by a control and evaluation device 7 in the preferred arrangement. For this purpose the control and evaluation device 7 is supplied the signals of the blue layer b, the green layer g and the red layer r of the particular pixels of the CMOS array 4 to produce a component color image (e.g. RGB). The array 4 can be preceded by a filter which blocks light of longer (infrared) wavelengths. No correction with the signals of the array 2 is then required. Said correction must only be carried out if the filter is lacking and the array 4 is also sensitive in the invisible range.

By means of the signals of the second linear CMOS array 5 the infrared image of the bank note BN is produced by the control and evaluation device 7. For this purpose a filter 6 is provided before the CMOS array 5 for passing only the infrared range of light, e.g. with a wavelength greater than 850 nm. The signals of the blue layer b, the green layer g and the red layer r of the particular pixels of the CMOS array 5 are supplied to the control and evaluation device 7 which evaluates the signals and assembles them into the infrared image. It is particularly advantageous if the signals of the blue, green and red layers b, g and r of the CMOS array 5 are summed by the control and evaluation device 7 for this purpose. This procedure offers the advantage that the lower sensitivity of CMOS arrays in the infrared range (see FIG. 3), e.g. in a wavelength range greater than 850 nm, is improved by summation of the signals of the three layers b, g, r. Due to the smaller layer thicknesses of the layers b and g, however, the layer r contributes the main share to the infrared signal.

Besides the embodiment shown above with reference to the figures, diverse variations and modifications of the described apparatus are possible.

For example, it can be provided that the distance between the two CMOS arrays 4 and 5 is selected as small as possible. This permits the color image from the CMOS array 4 and the infrared image from the CMOS array 5 to be produced almost without parallactic errors. The CMOS array used in the apparatus 1 can for this purpose be constructed of single linear CMOS arrays, but it is also possible to use a CMOS array which provides the required lines on a common substrate.

It can likewise be provided that a diaphragm or optic is also provided before the CMOS array 4, 5 to realize certain imaging properties.

As a further variant it is possible to check other invisible ranges of light with the apparatus 1. For this purpose it can be provided that the filter 6 is replaced e.g. by a filter which passes only or additionally short-wave light, e.g. UV light. It is likewise possible to use a further, third CMOS array provided with a corresponding filter in addition to the two CMOS arrays 4 and 5.

It is obvious that, instead of the described check of the bank notes BN by the apparatus 1 with light transmitted by the bank notes BN, the apparatus 1 can also be designed so that light reflected by the bank notes BN is instead or additionally evaluated, for which purpose the CMOS array 4, 5 and the light source 2 are disposed on one side of the bank note BN.

It is likewise obvious that instead of the bank notes BN being transported along their longitudinal sides as shown in the figures, transport can also be effected along the short sides of the bank notes BN. In this case the dimensions of the CMOS array 4, 5 and the light source 2 or its diaphragm 3 or any optics present must be adapted accordingly.

The invention claimed is:

1. An apparatus for checking bank notes including a semiconductor array which scans the bank notes to be checked, the semiconductor array comprising at least two parallel spaced, linear semiconductor arrays, and wherein the bank notes are moved for the check past the semiconductor arrays and illuminated by a light source, comprising:

the at least two parallel spaced linear semiconductor arrays each comprise at least three successive layers which are maximally sensitive to light of different wavelengths, including a first linear semiconductor array arranged to scan the bank notes in a defined range of sensitivity of the semiconductor, and a second linear semiconductor array arranged to scan the bank notes in a sensitivity spectrum range different therefrom, for which purpose at least the second linear semiconductor array has a filter which passes only a part of the spectrum.

2. The apparatus according to claim 1, wherein the first semiconductor array is sensitive to the total spectrum, and the filter of the second filter array passes only the invisible part of the spectrum.

3. The apparatus according to claim 1, wherein the first semiconductor array is sensitive to the total spectrum, and the filter of the second semiconductor array is provided with a filter which passes only the visible part of the spectrum but blocks the invisible part.

4. The apparatus according to claim 1, wherein the first semiconductor array is provided with a filter which passes only the visible part of the spectrum, and the filter of the second semiconductor array passes only an invisible part of the spectrum.

5. The apparatus according to any one of claims 2 to 4, wherein the invisible part of the spectrum is in the infrared range.

6. The apparatus according to any one of claims 2 to 4, wherein the invisible part of the spectrum is in the ultraviolet range.

7. The apparatus according to claim 1, including a control and evaluation device which is arranged to process and evaluate signals from the two semiconductor arrays in order to produce a three-color image and at least one image in the range of invisible light from the signals of the layers of the two linear semiconductor arrays by a combination of the signals for each bank note to be checked.

8. The apparatus according to claim 1, wherein the semiconductor array and the light source are disposed on at least one of the same side and different sides of the bank note.

9. The apparatus according to claim 1, wherein the two linear semiconductor arrays are located on a single substrate.

10. The apparatus according to claim 1, wherein the two semiconductor arrays are made of silicon.

* * * * *